United States Patent
Talty et al.

(10) Patent No.: US 11,867,844 B2
(45) Date of Patent: Jan. 9, 2024

(54) LIDAR SPECTRUM ANALYZER

(71) Applicant: GM GLOBAL TECHNOLOGY OPERATIONS LLC, Detroit, MI (US)

(72) Inventors: Timothy J. Talty, Beverly Hills, MI (US); Michael Mulqueen, Malibu, CA (US); James Chingwei Li, Simi Valley, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 826 days.

(21) Appl. No.: 16/582,434

(22) Filed: Sep. 25, 2019

(65) Prior Publication Data

US 2020/0110161 A1 Apr. 9, 2020

Related U.S. Application Data (60) Provisional application No. 62/741,692, filed on Oct. 5, 2018.

(51) Int. Cl.
*G01C 21/00* (2006.01)
*G01S 7/4913* (2020.01)
(Continued)

(52) U.S. Cl.
CPC .......... *G01S 7/4913* (2013.01); *G01S 7/4808* (2013.01); *H03M 1/1255* (2013.01);
(Continued)

(58) Field of Classification Search
CPC ...... G01S 7/4808; G01S 17/04; G01S 13/931; G01S 17/06; G01S 17/58; G01S 17/93; H03M 1/1255
See application file for complete search history.

(56) References Cited

U.S. PATENT DOCUMENTS

| | | | |
|---|---|---|---|
| 4,922,256 A | 5/1990 | Brandstetter | |
| 2003/0076485 A1* | 4/2003 | Ruff | G01S 17/894 |
| | | | 356/5.09 |

(Continued)

FOREIGN PATENT DOCUMENTS

| | | |
|---|---|---|
| CN | 106125081 A | 11/2016 |
| CN | 107567592 A | 1/2018 |

(Continued)

OTHER PUBLICATIONS

Chinese Office Action Issued in Chinese Patent Application No. 201910948955.2 dated Apr. 29, 2023; 10 Pages.

*Primary Examiner* — Adam M Alharbi
(74) *Attorney, Agent, or Firm* — CANTOR COLBURN LLP (57) ABSTRACT

A Lidar system and method of detecting an object is disclosed. The Lidar system includes a photodetector, a spectrum analyzer and a processor. The photodetector generates an electrical signal in response to a reflected light beam received at the photodetector, the reflected light beam being a reflection of a chirp signal from the object. The electrical signal has a bandwidth the same as a bandwidth of the chirp signal. The spectrum analyzer includes a power divider that partitions the electrical signal into a plurality of channels, an analog-to-digital converter that converts the electrical signal within a selected channel from an analog signal to a digital signal, and a comb filter that provides output from the selected channel from the power divider to the analog-to-digital converter. The processor determines a parameter of the object from the digital signal in the selected channel.

15 Claims, 9 Drawing Sheets

(51) Int. Cl.
*G01S 7/48* (2006.01)
*H03M 1/12* (2006.01)
*G01S 17/58* (2006.01)
*G01S 17/06* (2006.01)
*G01S 13/931* (2020.01)
*G01S 17/04* (2020.01)
*G01S 17/93* (2020.01)

(52) U.S. Cl.
CPC .............. *G01S 13/931* (2013.01); *G01S 17/04* (2020.01); *G01S 17/06* (2013.01); *G01S 17/58* (2013.01); *G01S 17/93* (2013.01)

(56) References Cited

U.S. PATENT DOCUMENTS

2020/0333129 A1* 10/2020 Mohseni ............ G01B 9/02091
2021/0208249 A1*  7/2021 Liu ....................... G01S 7/4817

FOREIGN PATENT DOCUMENTS

| CN | 108287349 A | 7/2018 | |
|----|---|---|---|
| CN | 108603758 A | 9/2018 | |
| CN | 108627848 A * | 10/2018 | ........... G01B 11/026 |

* cited by examiner

LIDAR SPECTRUM ANALYZER

CROSS REFERENCE TO RELATED APPLICATION

This application claims the benefit of U.S. Provisional Application Ser. No. 62/741,692 filed Oct. 5, 2018, the contents of which are incorporated by reference herein in its entirety.

INTRODUCTION

The subject disclosure relates to systems and methods for detecting an object and, in particular, to a Lidar system design including a signal amplifier.

A Lidar system for a vehicle can use a photonic chip with a laser. The laser light is transmitted from the photonic chip and reflected off of an object. Differences between the transmitted light and the reflected light are determined using the reflected light beam and a local oscillator beam in order to determine various parameters of the object, such as its range, azimuth, elevation and velocity. In order to determine these parameters the transmitted light beam is frequency-modulated, often in the form of a "chirp" signal that sweeps across a bandwidth of frequencies. A frequency spectrum analyzer is then used to analyze the received signals. As the size of the bandwidth increases, the cost of a suitable frequency spectrum analyzer increases and its energy-efficiency decreases. Accordingly, it is desirable to analyze a frequency spectrum of the chirp signal with lower cost and decreased energy loss.

SUMMARY

In one exemplary embodiment, a method of detecting an object is disclosed. The method includes generating an electrical signal at a photodetector in response to a reflected light beam received at the photodetector, the reflected light beam being a reflection of a chirp signal from the object, wherein a bandwidth of the electrical signal is the same as a bandwidth of the chirp signal, partitioning the electrical signal into a plurality of channels, converting the electrical signal within a selected channel from an analog signal to a digital signal, at an analog-to-digital converter, and determining, at a processor, a parameter of the object from the digital signal in the selected channel.

In addition to one or more of the features described herein, each channel of the plurality of channels has a channel bandwidth, wherein the combined channel bandwidths spans the bandwidth of the electrical signal. The method further includes providing the plurality of channels to at least two comb filters. In various embodiments, the channels are distributed amongst the at least two comb filters in a sequential order. In an embodiment in which the at least one of the two comb filters includes a plurality of outputs, each output associated with a respective channel, the method further includes coupling each output from a selected channel to an analog-to-digital converter associated with the selected and providing the electrical signal within the selected channel to its associated analog-to-digital converter via the output. The method further includes generating a digital channel signal at each analog-to-digital converter, combining the digital channel signals, and determining the parameter of the object from the combined digital channel signals. The analog-to-digital converter associated with a selected channel is configured to operate over the bandwidth of the selected channel.

In another exemplary embodiment, a Lidar system is disclosed. The Lidar system includes a photodetector, a spectrum analyzer and a processor. The photodetector is configured to generate an electrical signal in response to a reflected light beam received at the photodetector, the reflected light beam being a reflection of a chirp signal from the object, a bandwidth of the electrical signal being the same as a bandwidth of the chirp signal. The spectrum analyzer includes a power divider configured to partition the electrical signal into a plurality of channels, an analog-to-digital converter configured to convert the electrical signal within a selected channel from an analog signal to a digital signal, and a comb filter configured to provide output from the selected channel of the power divider to the analog-to-digital converter. The processor is configured to determine a parameter of the object from the digital signal in the selected channel.

In addition to one or more of the features described herein, each channel of the plurality of channels has a channel bandwidth and the channel bandwidths, in combination, span a bandwidth of the electrical signal. The photodetector is a component of a photonic chip that generates the chirp signal. The power divider distributes the channels amongst the at least two comb filters in a sequential order. In an embodiment in which at least one of the at least two comb filters includes a plurality of outputs, each output associated with a respective channel and coupled to an associated analog-to-digital converter, the output is configured to provide the electrical signal within the selected channel to a its associated analog-to-digital converter. The plurality of analog-to-digital converters generate a plurality of digital signals and the processor is further configured to combine the plurality of digital signals and determine the parameter of the object from the combined plurality of digital signals. The analog-to-digital converter associated with a selected channel is configured to operate over the bandwidth of the selected channel.

In yet another exemplary embodiment, a Lidar system is disclosed. The Lidar system includes a photonic chip, a photodetector, a spectrum analyzer and a processor. The photonic chip is configured to generate a chirp signal and receive a reflected light beam that is a reflection of the chirp signal from an object, the chirp signal having an associated bandwidth. The photodetector is configured to generate an electrical signal in response to receiving the reflected light beam, a bandwidth of the electrical signal being the same as the bandwidth of the chirp signal. The spectrum analyzer includes a power divider configured to partition the electrical signal into a plurality of channels, an analog-to-digital converter configured to convert the electrical signal within a selected channel from an analog signal to a digital signal, and a comb filter configured to provide the output from the selected channel of the power divider to the analog-to-digital converter. The processor is configured to determine a parameter of the object from the digital signal in the selected channel.

In addition to one or more of the features described herein, each channel of the plurality of channels has a channel bandwidth and the channel bandwidths, in combination, span the bandwidth of the electrical signal. The power divider distributes the channels amongst the at least two comb filters in a sequential order. In an embodiment in which at least one of the at least two comb filters includes a plurality of outputs, each output associated with a respective channel and coupled to an associated analog-to-digital converter, the output is configured to provide the electrical signal within the selected channel to a its associated analogto-digital converter. The plurality of analog-to-digital converts generate a plurality of digital signals and the processor is further configured to combine the plurality of digital signals and determine the parameter of the object from the combined plurality of digital signals. The analog-to-digital converter associated with a selected channel is configured to operate over the bandwidth of the selected channel.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

Figure 1:
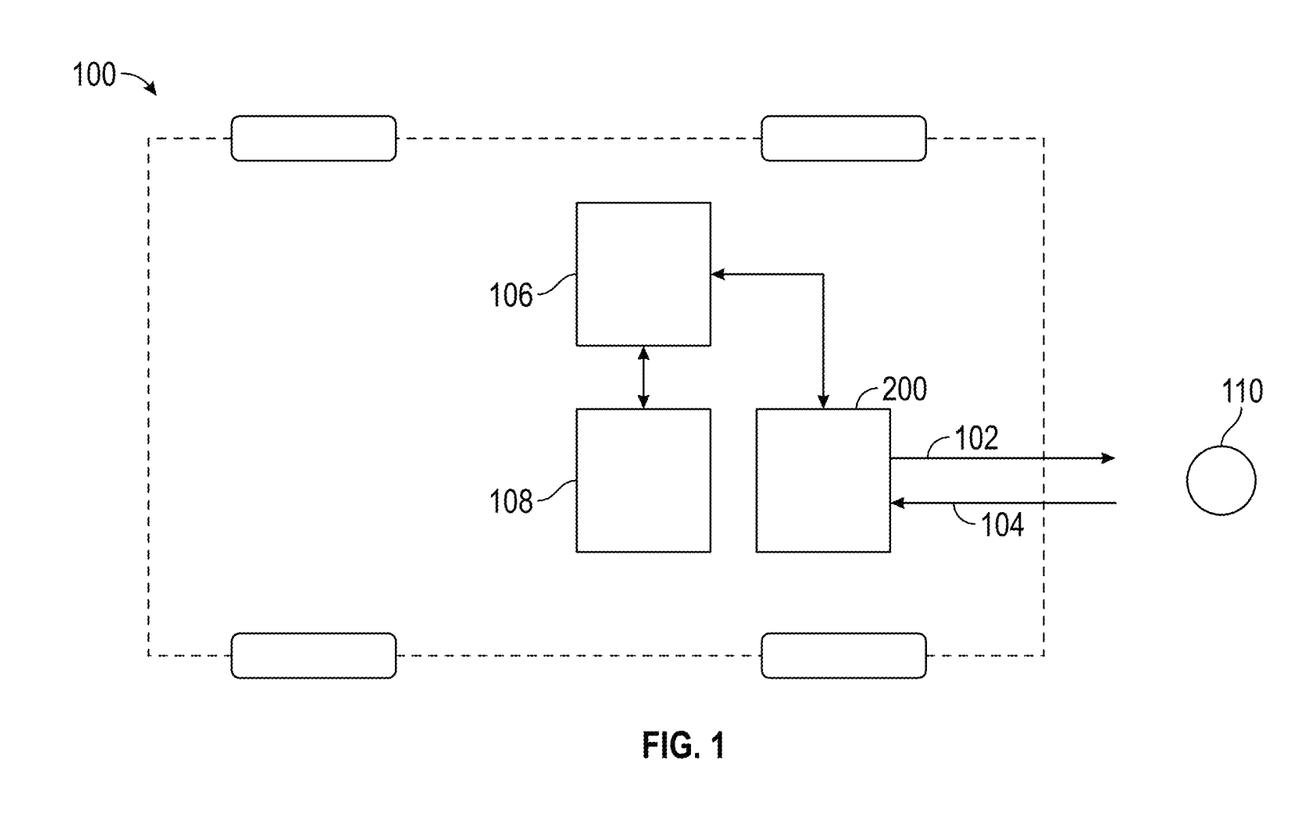
FIG. 1 shows a plan view of a vehicle suitable for use with a Lidar system.
Figure 2:
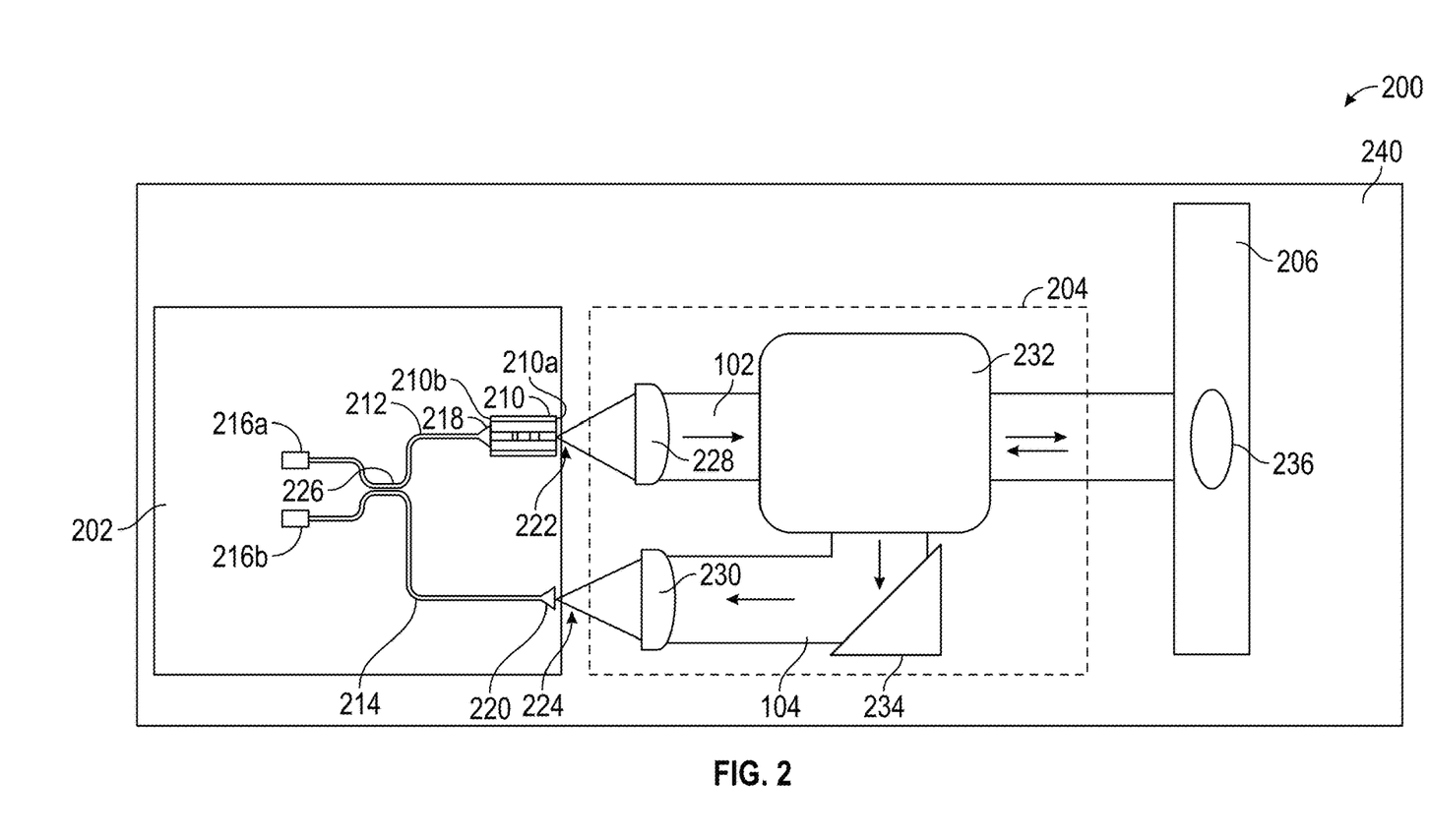
FIG. 2 shows a detailed illustration of an exemplary Lidar system suitable for use with the vehicle of FIG. 1.

In accordance with an exemplary embodiment, FIG. 1 shows a plan view of a vehicle 100 suitable for use with a Lidar system 200 of FIG. 2. The Lidar system 200 generates a transmitted light beam 102 that is transmitted toward an object 110. The object 110 can be any object external to the vehicle 100, such as another vehicle, a pedestrian, a telephone pole, etc. Reflected light beam 104, which is due to interaction of the object 110 and the transmitted light beam 102, is received back at the Lidar system 200. A processor 106 controls various operation of the Lidar system 200 such as controlling a light source of the Lidar system 200, etc. The processor 106 further receives data from the Lidar system 200 related to the differences between the transmitted light beam 102 and the reflected light beam 104 and determines various parameters of the object 110 from this data. The various parameters can include a distance or range of the object 110, azimuth location, elevation, Doppler (velocity) of the object, etc. The vehicle 100 may further include a navigation system 108 that uses these parameters to navigate the vehicle 100 with respect to the object 110 for the purposes of avoiding contact with the object 110. While discussed with respect to vehicle 100, the Lidar system 200 can be used with other devices in various embodiments, including chassis control systems and forward or pre-conditioning vehicle for rough roads.

FIG. 2 shows a detailed illustration of an exemplary Lidar system 200 suitable for use with the vehicle of FIG. 1. The Lidar system 200 includes an integration platform 240, which can be a Silicon platform, and various affixed components. A photonic chip 202, free space optics 204 and a microelectromechanical (MEMS) scanner 206 are disposed on the integration platform 240.

In various embodiments, the photonic chip 202 is part of a scanning frequency modulated continuous wave (FMCW) Lidar. The photonic chip 202 can be a silicon photonic chip in various embodiments. The photonic chip 202 can include a light source, a waveguide and at least one photodetector. In one embodiment, the photonic chip 202 includes a light source, such as a laser 210, a first waveguide 212 (also referred to herein as a local oscillator waveguide), a second waveguide 214 (also referred to herein as a return signal waveguide) and a set of photodetectors 216a and 216b. The photonic chip 202 further includes one or more edge couplers 218, 220 for controlling input of light into associated waveguides. The edge couplers can be spot size converters, gratings or any other suitable device for transitioning light between free space propagation and propagation within a waveguide. At a selected location, the first waveguide 212 and the second waveguide 214 approach each other to form a multi-mode interference (MMI) coupler 226.

The laser 210 is an integrated component of the photonic chip 202. The laser 210 can be any single frequency laser that can be frequency modulated and can generate light at a selected wavelength such as a wavelength that is considered safe to human eyes (e.g., 1550 nanometers (nm)). The laser 210 includes a front facet 210a and a back facet 210b. A majority of the energy from the laser 210 is transmitted into free space via the front facet 210a and a first aperture 222 (transmission aperture) of the photonic chip 202. A relatively small percentage of energy from the laser, also referred to as leakage energy, exits the laser 210 via the back facet 210b and is directed into the first waveguide 212.

The leakage energy used as the local oscillator beam can be varying, therefore affecting measurements related to the parameter of the object 110. In order to control power of the local oscillator beam, a variable attenuator can be used in the optical path of the local oscillator waveguide. When the power of the local oscillator beam exceeds a selected power threshold, the attenuator can be activated to limit the power local oscillator beam. Alternatively, a control voltage can be used at the laser 210 in order to control the gain of the laser 210 at the back facet 210b of the laser. The control voltage can be used to either increase or decrease the radiation or leakage energy at the back facet 210b.

The first waveguide 212 provides an optical path between the back facet 210b of laser 210 and the photodetectors 216a, 216b. An end of the first waveguide 212 is coupled to the back facet 210b of the laser 210 via first edge coupler 218. Leakage energy from the back facet 210b is directed into the first waveguide 212 via the first edge coupler 218.

The second waveguide 214 provides an optical path between a second aperture 224, also referred to as a receiver aperture, of the photonic chip 202 and the photodetectors

216a, 216b. The second edge coupler 220 at the second aperture 224 focuses the incoming reflected light beam 104 into the second waveguide 214.

The first waveguide 212 and second waveguide 214 form a multimode interference (MMI) coupler 226 at a location between their respective apertures (222, 224) and the photodetectors (216a, 216b). Light in the first waveguide 212 and light in the second waveguide 214 interfere with each other at the MMI coupler 226 and the results of the interference are detected at photodetectors 216a and 216b. Measurements at the photodetectors 216a and 216b are provided to the processor 106, FIG. 1, which determines various characteristics of the reflected light beam 104 and thus various parameters of the object 110, FIG. 1. The photodetectors 216a and 216b convert the light signal (i.e., photons) to an electrical signal (i.e., electrons). The electrical signal generally requires additional signal processing such as amplification, conversion from an electrical current signal to an electrical voltage signal, and conversion from an analog signal into a discrete digital signal prior to be provided to the processor 106.

The free space optics 204 includes a collimating lens 228 a focusing lens 230, an optical circulator 232 and a turning mirror 234. The collimating lens 228 changes the curvature of the transmitted light beam 102 from a divergent beam (upon exiting the front facet 210a of laser 210b to a collimated or parallel beam of light. The optical circulator 232 controls a direction of the transmitted light beam 102 and of the reflected light beam 104. The optical circulator 232 directs the transmitted light beam 102 forward without any angular deviation and directs the incoming or reflected light beam 104 by a selected angle. In various embodiments, the selected angle is a 90 degree angle, but any suitable angle can be achieved. The reflected light beam 104 is directed toward the focusing lens 230 at turning mirror 234. The focusing lens 230 changes the curves of the reflected light beam 104 from a substantially parallel beam of light to a converging beam of light. The focusing lens 230 is placed at a distance from second aperture 224 that allows concentration of the reflected light beam 104 onto the second edge coupler 220 at the second aperture 224.

The MEMS scanner 206 includes a mirror 236 for scanning the transmitted light beam 102 over a plurality of angles. In various embodiments, the mirror 236 is able to rotate along two axes, thereby scanning the transmitted light beam 102 over a selected area. In various embodiments, the mirror axes include a fast axis having a scan angle of about 50 degrees and a quasi-static slow axis having a scan angle of about 20 degrees. The MEMS scanner 206 can direct the transmitted light beam in a selected direction and receives a reflected light beam 104 from the selected direction.

Figure 3:
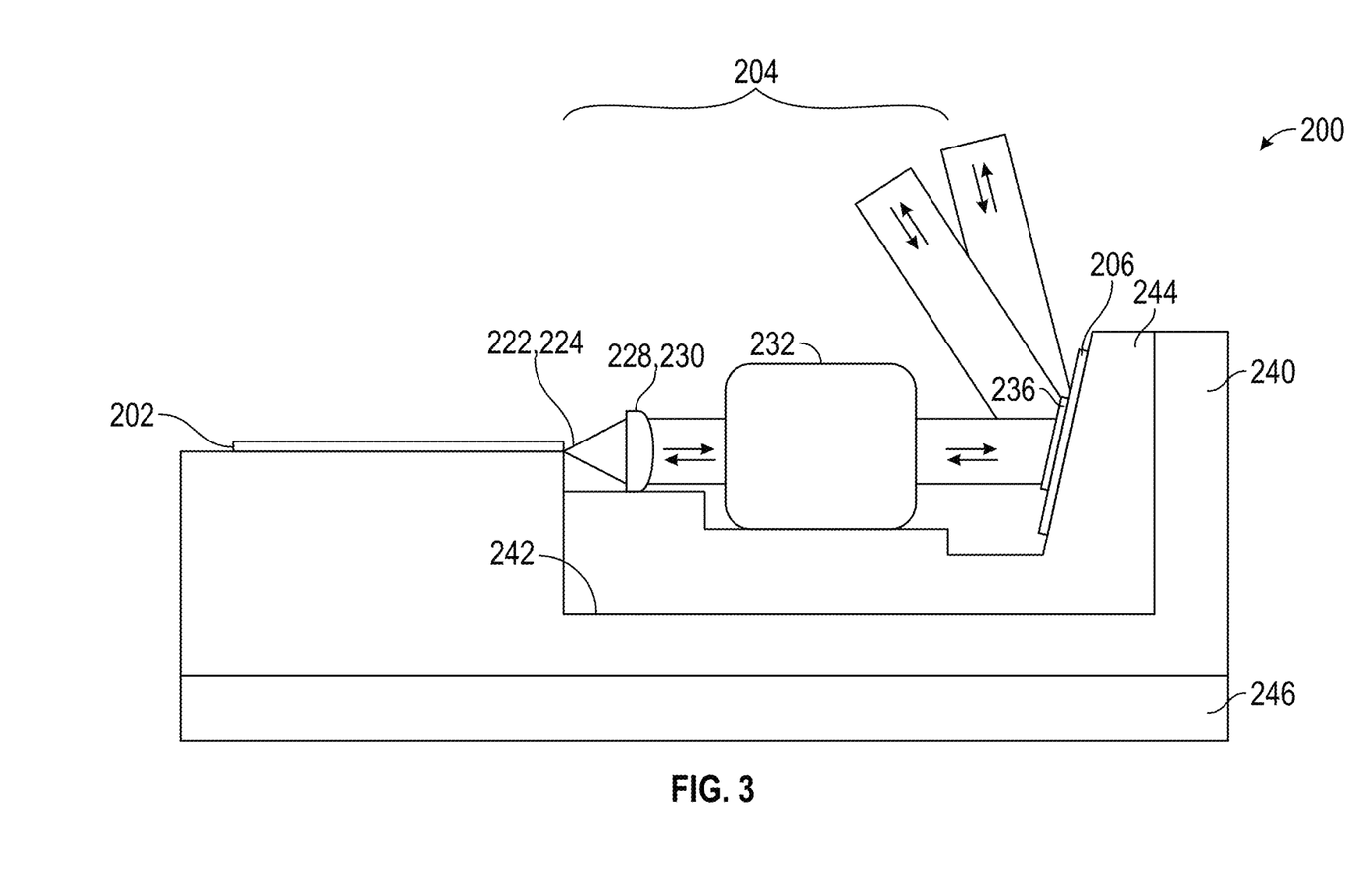
FIG. 3 shows a side view of the Lidar system of FIG. 2.

FIG. 3 shows a side view of the Lidar system 200 of FIG. 2. The integration platform 240 includes the photonic chip 202 disposed on a surface of the integration platform 240. The integration platform 240 includes a pocket 242 into which an optical submount 244 can be disposed. The free space optics 204 and the MEMS scanner 206 can be mounted on the optical submount 244 and the optical submount can be aligned within pocket 242 in order to align the collimating lens 228 with the first aperture 222 of the photonic chip 202 and align the focusing lens 230 with the second aperture 224 of the photonic chip. The optical submount 244 can be made of a material that has a coefficient of thermal expansion that matches or substantially matches the coefficient of thermal expansion of the integration platform 240, in order to maintain the alignment between the free space optics 204 and the photonic chip 202.

The integration platform 240 can be coupled to a printed circuit board 246. The printed circuit board 246 includes various electronics for operation of the components of the Lidar system 200, including controlling operation of the laser 210, FIG. 2 of the photonic chip 202, controlling oscillations of the mirror 236, receiving signals from the photodetectors 216a and 216b and processing the signals in order to determine various characteristics of the reflected light beam 104 and thereby determine various parameters of object 110, FIG. 1 associated with the reflected light beam.

The use of an optical submount 244 is one possible implementation for an embodiment of the integration platform 240. In another embodiment, an optical submount 244 is not used and the free space optics 204 and MEMS mirror 236 are disposed directly on the integration platform 240.

Figure 4:
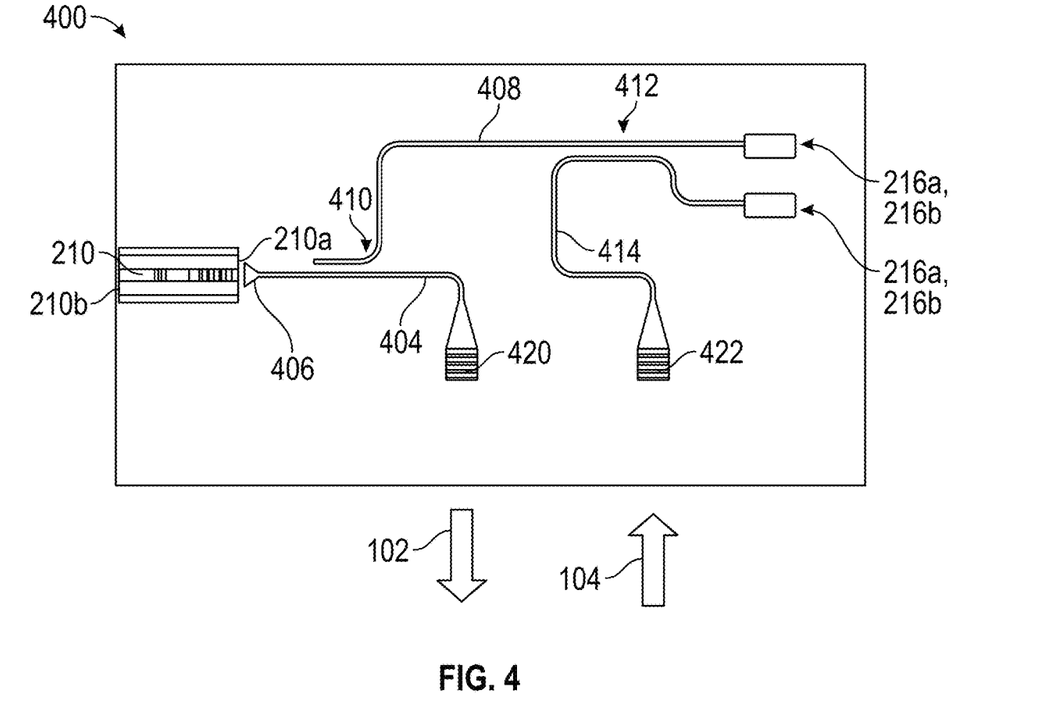
FIG. 4 shows an alternative photonic chip that can be used with the Lidar system in place of the photonic chip of FIG. 2.

FIG. 4 shows an alternative photonic chip 400 that can be used with the Lidar system 200 in place of the photonic chip 202 of FIG. 2. In various embodiments, the photonic chip 400 is part of a scanning frequency modulated continuous wave (FMCW) Lidar and can be a silicon photonic chip. The photonic chip 400 includes a coherent light source such as a laser 210 that is an integrated component of the photonic chip 400. The laser 210 can be any single frequency laser that can be frequency modulated. In various embodiments, the laser 210 generates light at a selected wavelength, such as a wavelength considered safe to human eyes (e.g., 1550 nanometers (nm)). The laser includes a front facet 210a out of which a majority of the laser energy exits from the laser 210 and a back facet 210b out of which a leakage energy exits. The energy which leaks out the back facet 210b can be coupled to a photodetector (not shown) for the purposes of monitoring the performance of the laser 210. The front facet 210a of laser 210 is coupled to a transmitter waveguide 404 via a laser-faced edge coupler 406 that receives the light from the laser 210. The transmitter waveguide 404 directs the light from the front facet 210a of laser 210 out of the photonic chip 400 via a transmission edge coupler 420 as transmitted light beam 102.

A local oscillator (LO) waveguide 408 is optically coupled to the transmitter waveguide 404 via a directional coupler/splitter or a multi-mode interference (MMI) coupler/splitter 410 located between the laser 210 and the transmission edge coupler 420. The directional or MMI coupler/splitter 410 splits the light from the laser 210 into the transmitted light beam 102 that continues to propagate in the transmitter waveguide 404 and a local oscillator beam that propagates in the local oscillator waveguide 408. In various embodiments, a splitting ratio can be 90% for the transmitted light beam 102 and 10% for the local oscillator beam. The power of a local oscillator beam in the local oscillator waveguide 408 can be control by use of a variable attenuator in the LO waveguide 408 or by use of a control voltage at the laser 210. The local oscillator beam is directed toward dual-balanced photodetectors 216a, 216b that perform beam measurements and convert the light signals to electrical signals for processing.

Incoming or reflected light beam 104 enters the photonic chip 400 via receiver waveguide 414 via a receiver edge coupler 422. The receiver waveguide 414 directs the reflected light beam 104 from the receiver edge coupler 422 towards the dual-balanced photodetector 216a, 216b. The receiver waveguide 414 is optically coupled to the local oscillator waveguide 408 at a directional or MMI coupler/combiner 412 located between the receiver edge coupler 422 and the photodetectors 216a, 216b. The local oscillator beam and the reflected light beam 104 interact with each other at the directional or MMI coupler/combiner 412 before being received at the dual-balanced photodetector 216a, 216b. In various embodiments, the transmitter waveguide 404, local oscillator waveguide 408 and receiver waveguide 414 are optical fibers.

Figure 5:
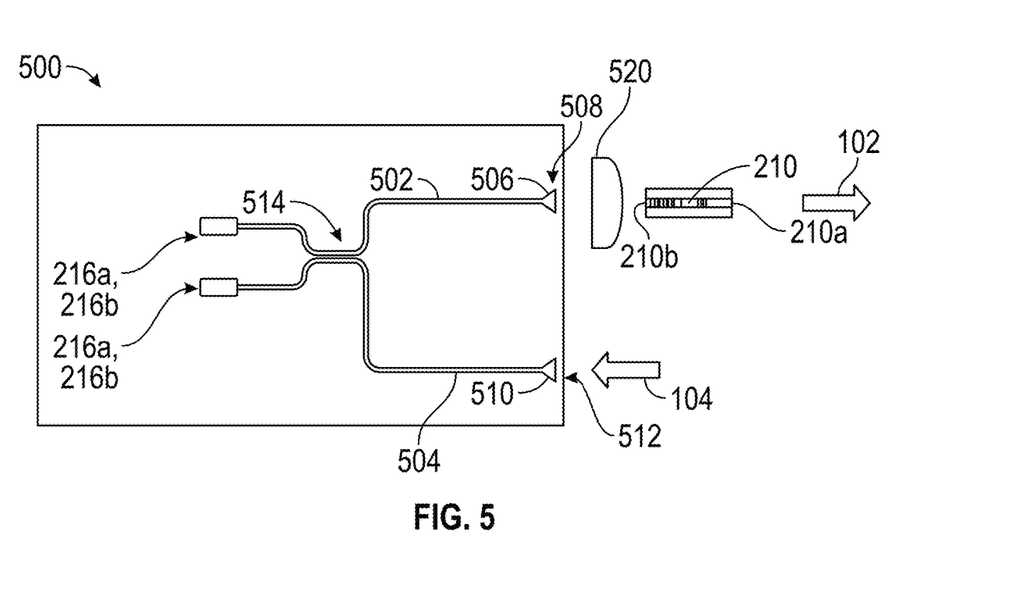
FIG. 5 shows another alternative photonic chip that can be used in place of the photonic chip of FIG. 2.

FIG. 5 shows another alternative photonic chip 500 that can be used in place of the photonic chip 202 of FIG. 2. The alternative photonic chip 500 has a design in which the laser 210 is not integrated onto the photonic chip 500. The photonic chip 500 includes a first waveguide 502 for propagation of a local oscillator beam within the photonic chip 500 and a second waveguide 504 for propagation of a reflected light beam 104 within the photonic chip 500. One end of the first waveguide 502 is coupled to a first edge coupler 506 located at a first aperture 508 of the photonic chip 500 and the first waveguide 502 directs the signal towards photodetectors 216a and 216b. One end of the second waveguide 504 is coupled to a second edge coupler 510 located at a second aperture 512 and the second waveguide 504 directs the signal towards photodetectors 216a, 216b. The first waveguide 502 and the second waveguide 504 approach each other at a location between their respective edge couplers 506, 510 and the photodetectors 216a, 216b to form an MMI coupler 514 in which the local oscillator beam and the reflected light beam 104 interfere with each other.

The laser 210 is off-chip (i.e., not integrated into the photonic chip 500) and is oriented with its back facet 210b directed towards the first edge coupler 506. The laser 210 can be any single frequency laser that can be frequency modulated. In various embodiments, the laser 210 generates light at a selected wavelength, such as a wavelength considered safe to human eyes (e.g., 1550 nanometers (nm)). A focusing lens 520 is disposed between the back facet 210b and the first aperture 508 and focuses the leakage beam from the back facet 210b onto the first edge coupler 506 so that the leakage beam enters the first waveguide 502 to serve as the local oscillator beam. The power of a local oscillator beam in the first waveguide 502 can be controlled by use of a variable attenuator in the first waveguide 502 or by use of a control voltage at the laser 210. Light exiting the laser 210 via the front facet 210a is used as the transmitted light beam 102 and is directed over a field of view of free space in order to be reflected off of an object 110, FIG. 1 within the field of view. The reflected light 104 is received at the second edge coupler 510 via suitable free space optics (not shown).

Figure 6:
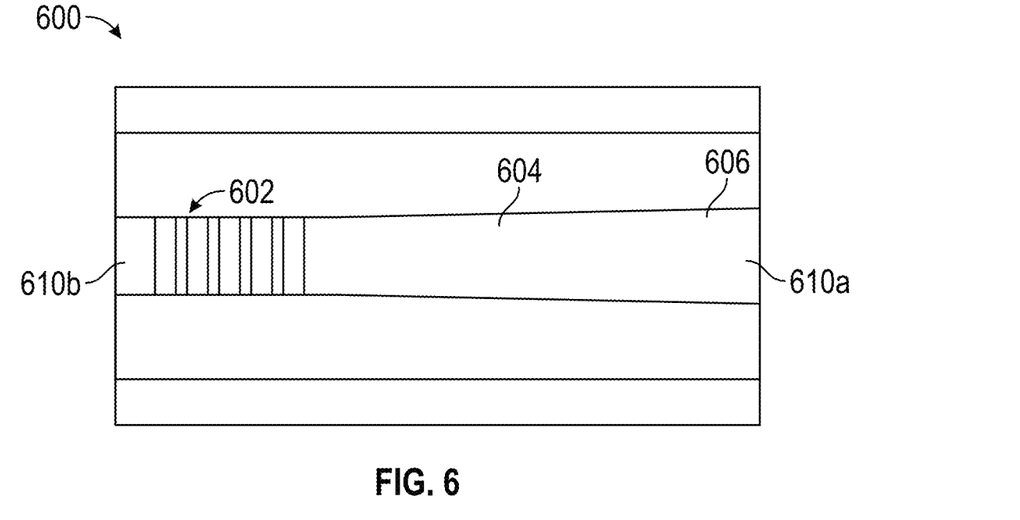
FIG. 6 shows a tapered Distributed Bragg Reflection (DBR) Laser Diode.

FIG. 6 shows a tapered Distributed Bragg Reflection (DBR) Laser Diode 600. The DBR Laser Diode 600 can be used as the laser 210 for the photonic chips 202, 400 and 500 of the Lidar system 200. The DBR Laser Diode 600 includes a highly reflective DBR back mirror 602 at a back facet 610b of the DBR Laser Diode, a less reflective front mirror 606 at a front facet 610a of the DBR Laser Diode and a tapered gain section 604 between the DBR back mirror 602 and the front mirror 606. The DBR back mirror 602 includes alternating regions of materials with different indices of refraction. Current or energy can be applied at the tapered gain section 604 to generate light at a selected wavelength.

Figure 7:
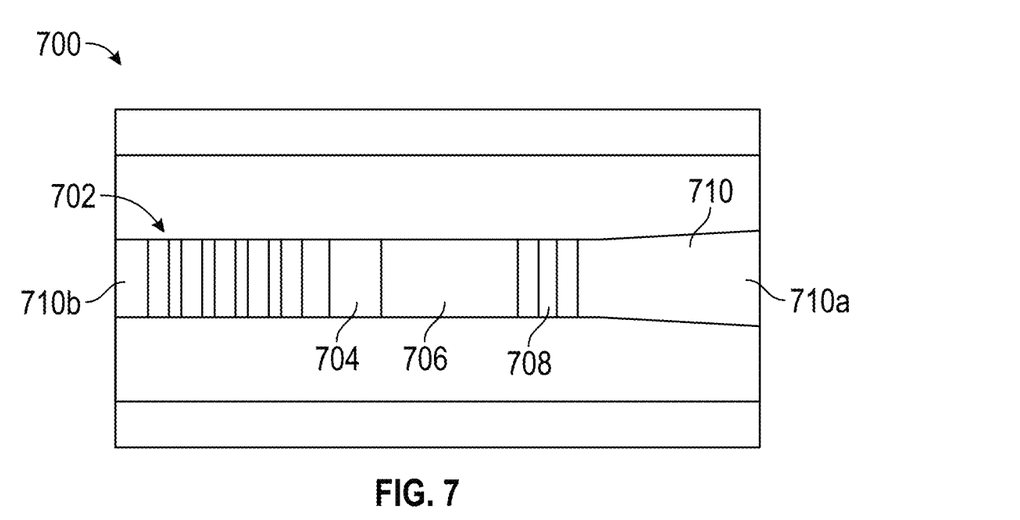
FIG. 7 shows details of a Master Oscillator Power Amplifier (MOPA) in an embodiment.

FIG. 7 shows details of a Master Oscillator Power Amplifier (MOPA) 700 in an embodiment. The MOPA 700 can be used as the laser 210 for the photonic chips 202, 400 and 500 of the Lidar system 200.

The MOPA 700 includes a highly reflective DBR back mirror 702 located at a back facet 710b and a less reflective DBR front mirror 708 near the front facet 710a. A phase section 704 and a gain section 706 are located between the back mirror 702 and the front mirror 708. The phase section 704 adjusts the modes of the laser and the gain section 706 includes a gain medium for generating light at a selected wavelength. The light exiting the front mirror 708 passes through an amplifier section 710 that increases light intensity.

In various embodiments, the laser has a front facet output power of 300 milliWatts (mW) and has a back facet output power of about 3 mW, while maintaining a linewidth of less than about 100 kilohertz (kHz). The MOPA 700, while having a more complicated design than the DBR Laser Diode 600, is often more dependable in producing the required optical power at the front facet while maintaining single-frequency operation and single-spatial mode operation.

Figure 8:
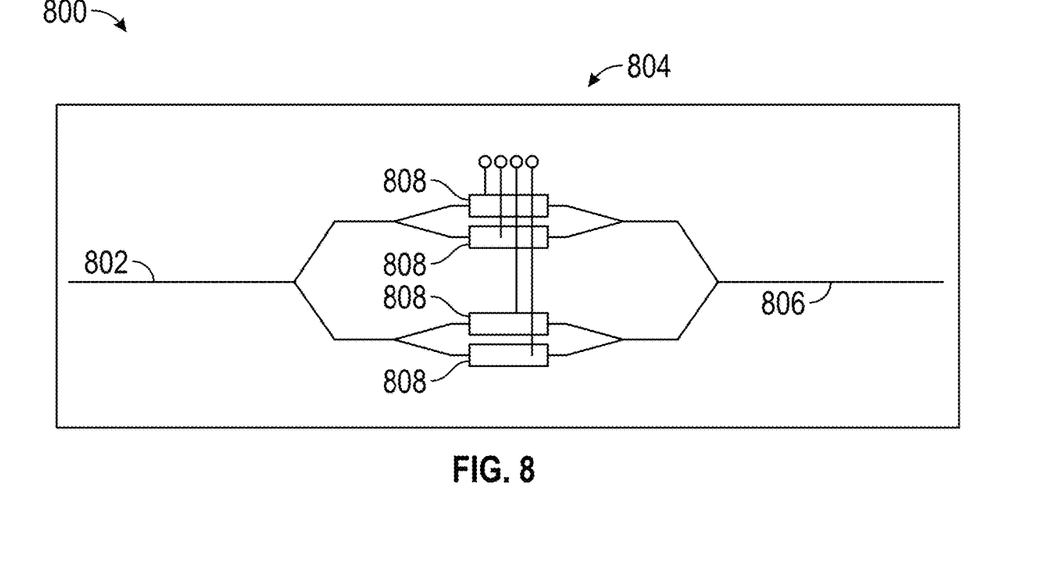
FIG. 8 shows an optical frequency shifter using an Integrated Dual I&Q Mach-Zehnder Modulator (MZM)

FIG. 8 shows an optical frequency shifter 800 using an Integrated Dual I&Q Mach-Zehnder Modulator (MZM) 804. The optical frequency shifter 800 can be used to alter a frequency or wavelength of a local oscillator beam in order to reduce ambiguity in measurements of the reflected light beam 104. The optical frequency shifter 800 includes an input waveguide 802 providing light at a first wavelength/frequency, also referred to herein as a diode wavelength/frequency ($\lambda_D/f_D$), to the MZM 804. The frequency shifter 800 further includes an output waveguide 806 that receives light at a shifted wavelength/frequency ($\lambda_D-\lambda_m/f_D+f_m$) from the MZM 804. The $\lambda_m$ and $f_m$ are the wavelength shift and frequency shift, respectively, imparted to the light by the MZM 804.

At the MZM 804, the light from the input waveguide 802 is split into several branches. In various embodiments, there are four branches to the MZM 804. Each branch includes an optical path shifter 808 that can be used to increase or decrease the length of the optical path and hence change the phase delay along the selected branch. A selected optical path shifter 808 can be a heating element that heats the branch in order to increase or decrease the length of the branch due to thermal expansion or contraction. A voltage can be applied to control the optical path shifter 808 and therefore to control the increase of decrease of the length of the optical path. Thus, an operator or processor can control the value of the change in wavelength/frequency ($\lambda_m/f_m$) and thus the shifted wavelength/frequency ($\lambda_D-\lambda_m/f_D+f_m$) in the output waveguide 806.

Figure 9:
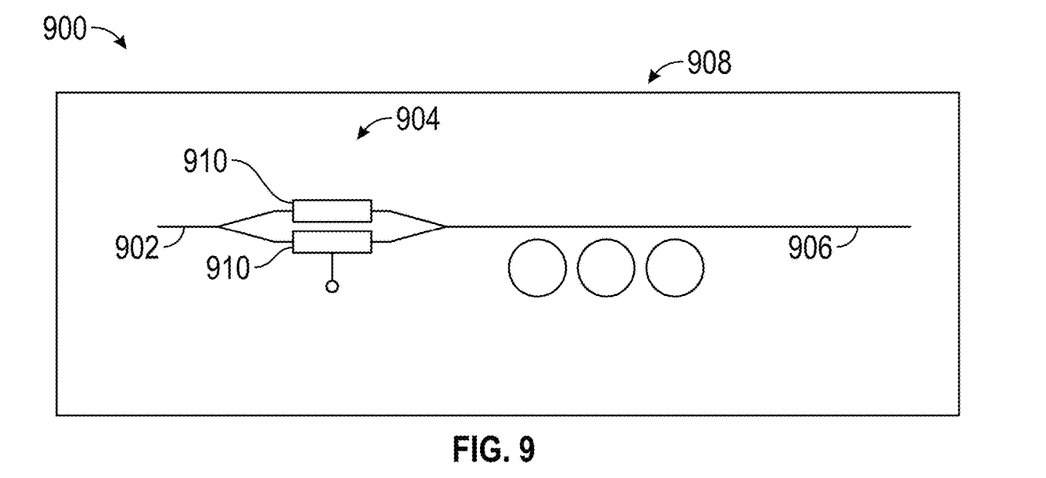
FIG. 9 shows an optical frequency shifter in an alternate embodiment.

FIG. 9 shows an optical frequency shifter 900 in an alternate embodiment. The optical frequency shifter 900 includes a single Mach-Zehnder Modulator (MZM) 904 and a High-Q Ring Resonator Optical Filter 908. The single MZM 904 has two branches of waveguides, each branch having an optical path shifter 910. An input waveguide 902 directs light into the single MZM 904 with an operating wavelength/frequency ($\lambda_D/f_D$), where the light is split among the branches of the single MZM 904. The optical path shifters 910 are activated to impart a change in frequency/wavelength ($\lambda_m/f_m$) to the light. Light from the MZM 904 passes through the optical filter 908 via output waveguide 906 in order to reduce harmonics generated by the single MZM 904. In various embodiments, light exiting via the optical filter 908 has wavelength/frequency ($\lambda_D-\lambda_m/f_D+f_m$).

In various embodiments, the optical frequency shifter (800, 900) shifts the optical frequency of the local oscillator beam by up to about 115 Megahertz (Mhz). The Integrated Dual I&Q MZM 804 is able to achieve a wide range of optical shifting, such as by an amount greater than 1 Gigahertz (GHz) while generating only a low level of harmonics (i.e., <−20 dB). Often, the Integrated Dual I&Q MZM 804 is selected over the Integrated Single MZM and High-Q Ring Resonator Optical Filter 908, although its design is more complex.

Figure 10:
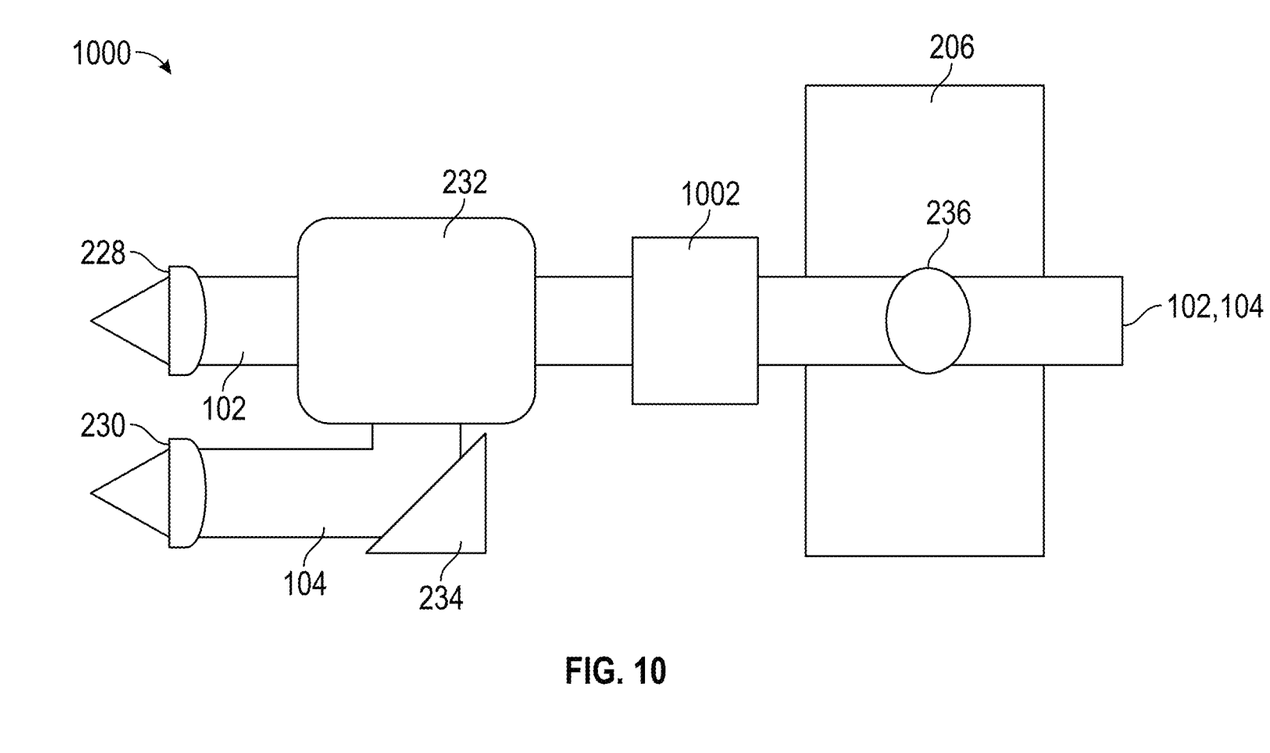
FIG. 10 shows an alternate configuration of free space optics and MEMS scanner for use with the Lidar system of FIG. 2.

FIG. 10 shows an alternate configuration 1000 of free space optics 204 and MEMS scanner 206 for use with the Lidar system 200, FIG. 2. The free space optics includes the collimating lens 228, focusing lens 230, optical circulator 232 and turning mirror 234 as shown in FIG. 2. The free space optics further includes a turning mirror 1002 that directs the transmitted light beam 102 from the optical circulator 232 onto the mirror 236 of the MEMS scanner 206 and directs the reflected light beam 104 from the mirror 236 of the MEMS scanner 206 to the optical circulator 232. The turning mirror can deflect the light out of the plane of the free space optics and can include a plurality of turning mirrors in various embodiments.

Figure 11:
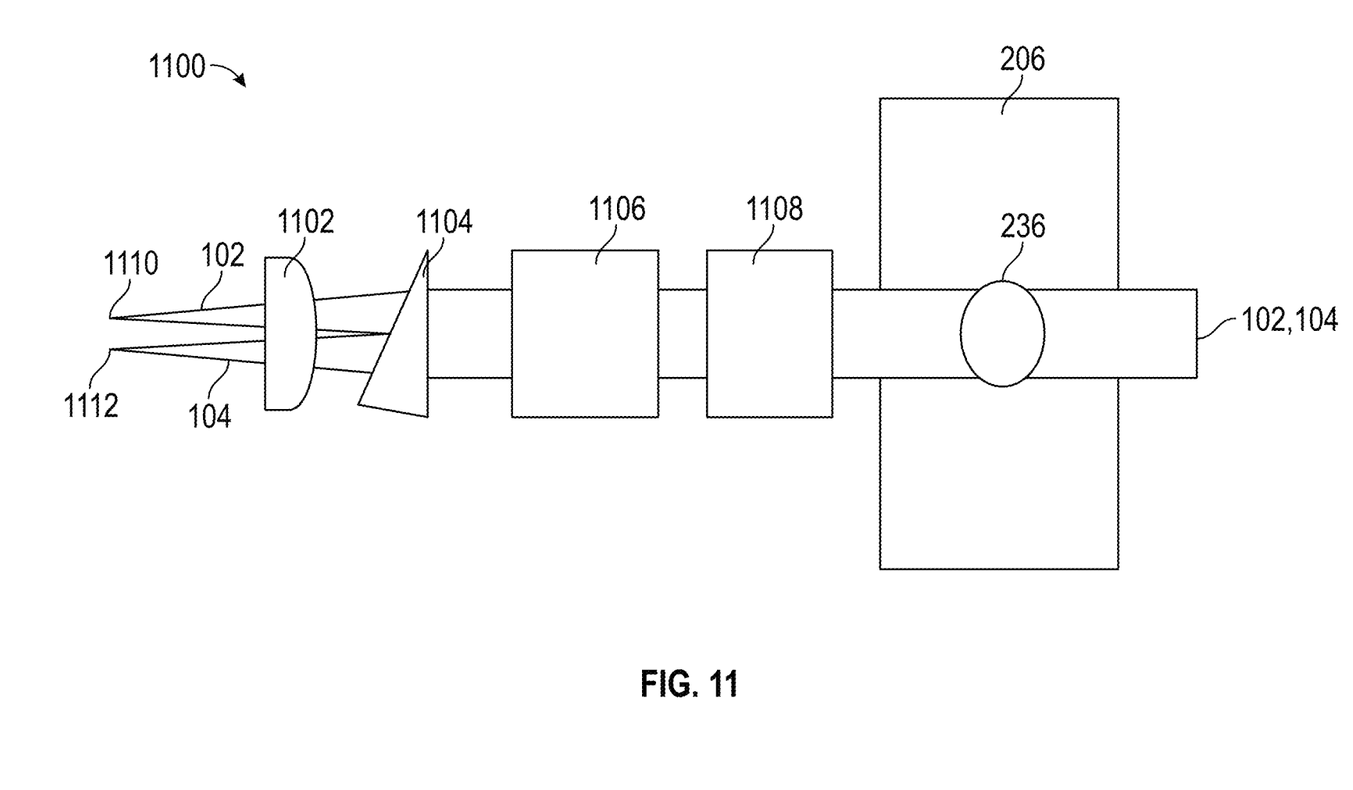
FIG. 11 shows an alternate configuration of free space optics and MEMS scanner for use with the Lidar system of FIG. 2.

FIG. 11 shows an alternate configuration 1100 of free space optics 204 and MEMS scanner 206 for use with the Lidar system 200, FIG. 2. The free space optics includes a single collimating and focusing lens 1102, a birefringent wedge 1104, a Faraday rotator 1106 and a turning mirror 1108. The collimating and focusing lens 1102 collimates the transmitted light beam 102 traveling in one direction and focuses the reflected light beam 104 traveling in the opposite direction. The birefringent wedge 1104 alters a path of a light beam depending on a polarization direction of the light beam. The Faraday rotator 1106 affects the polarization directions of the light beams. Due to the configuration of the birefringent wedge 1104 and the Faraday rotator 1106, the transmitted light beam 102 is incident on the birefringent wedge 1104 with a first polarization direction and the reflected light beam 104 is incident on the birefringent wedge 1104 with a second polarization direction that is different from the first polarization direction, generally by a 90 degree rotation of the first polarization direction. Thus the transmitted light beam 102 can exit the photonic chip at a first aperture 1110 and be deviated to travel along selected direction at mirror 236 of MEMS scanner 206. Meanwhile the reflected light beam 104, travelling in the opposite direction as the transmitted light beam 102 at the MEMS scanner 206, is deviated onto another direction that is directed towards a second aperture 1112 of the photonic chip.

A turning mirror 1108 directs the transmitted light beam 102 from the Faraday rotator 1106 onto the mirror 236 of the MEMS scanner 206 and directs the reflected light beam 104 from the mirror 236 of the MEMS scanner 206 to the Faraday rotator 1106. The turning mirror 1008 can deflect the light out of the plane of the free space optics and can include a plurality of turning mirrors in various embodiments.

Figure 12:
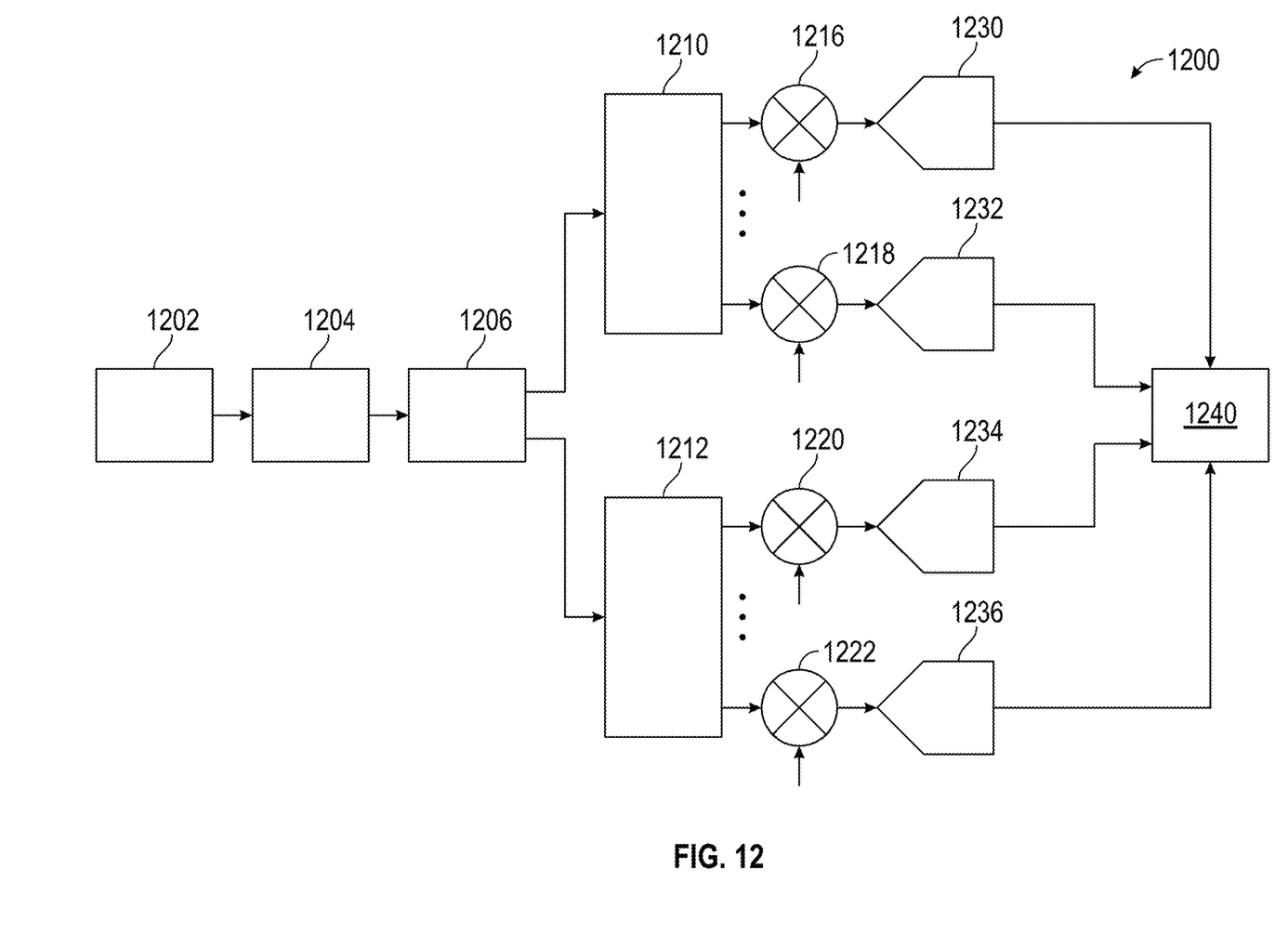
FIG. 12 shows a frequency spectrum analyzer for a Lidar system.

FIG. 12 shows a frequency spectrum analyzer 1200 for a Lidar system. A plurality of photodetectors 1202 receive an optical signal and generate an electrical signal in response to the optical signal. In various embodiments, the photodetectors 1202 are a component of a photonic chip of a Lidar system, such as any of the photonic chips shown in FIGS. 2-5, for example. The optical signal received at the photodetectors 1202 is a combination of a reflected light beam and a local oscillator beam. The local oscillator beam is related to a transmitted light beam generated at a laser of the photonic chip. The reflected light beam is a reflection of the transmitted light beam from an object in an environment of the Lidar system.

The laser generates a frequency modulated signal. The frequency modulated signal can be a "chirp" signal that changes frequency over a selected bandwidth from a first frequency to a second frequency during the duration of the chirp signal. In general, but not necessarily, the frequency scans the bandwidth in a linear fashion. The frequency of the optical signal received at the photodetectors 1202 therefore extends over the selected bandwidth and the frequency of the electrical signal generated by the photodetectors 1202 also extends over the selected bandwidth.

The electrical signal is received at a trans-impedance amplifier 1204 which amplifies the electrical signal in order to increase a signal-to-noise ratio and reduce noise levels. The amplified signal is output to a power divider 1206. The power divider 1206 partitions the electrical signal into a plurality of channels based on frequency and provides the channels to one or more comb filters. For illustrative purposes, two comb filters are shown, (i.e., Comb Filter A (1210) and Comb Filter B (1212)). However, additional comb filters can be used in alternate embodiments. In the illustrative embodiment, the power divider 1206 separates the electrical signal amongst Comb Filter A (1210) and Comb Filter B (1212).

For illustrative purposes, the electrical signal from photodetectors 1202 having a bandwidth of 1 GigaHertz (GHz) (spanning from 0 Hz to 1 GHz) is provided to the power divider 1206. The power divider is programmed to partition the bandwidth into 25 separate channels, such that the combined channel bandwidths of the channels covers or spans the bandwidth of the electrical signal. Thus, each channel has a channel bandwidth of 40 MHz. The power divider 1206 provides the electrical signal to Comb Filter A (1210) and to Comb Filter B (1212). For illustrative purposes, Comb Filter A (1210) receives the following channels: 0-40, 80-120, 160-200, 240-280, 320-360, 400-440, 480-520, 560-600, 640-680, 720-760, 800-840, 880-920, 960-1000 MHz, and Comb Filter B (1212) receives the following channels: 40-80, 120-160, 200-240, 280-320, 360-400, 440-480, 520-560, 600-640, 680-720, 760-800, 840-880, 920-960 MHz.

In an embodiment in which N comb filters are used, with N>2, the power divider partitions the channels sequentially or in a sequential order, with the first channel being directed to the first comb filter, the second channel being directed to the second comb filter, and so on continuing in this manner until the the $N^{th}$ channel receives a channel, and then returning to the first channel to repeating the sequential partitioning until the last channel is distributed.

Each of Comb Filter A (1210) and Comb Filter B (1212) includes outlets associated with respective channels received at the respective comb filter. Comb Filter A (1210) includes outlets LOA00 (1216) through LOA11 (1218) and Comb Filter B (1212) includes outlets LOB00 (1220) through LOB11 (1222). In one embodiment, outlet LOA00 (1216) of Comb Filter A (1210) is associated with the 0-40 MHz channel, while outlet LOB00 (1220) of Comb Filter B (1212) is associated with the 40-80 MHz channel. Each outlet provides their respective channels to an associated analog-to-digital converter (ADC A00 (1230) through ADC A11 (1232) for Comb Filter A (1210) and ADC BOO (1234) through ADC B11 (1236) for Comb Filter B (1212)). Each associated analog-to-digital converter converts their respective channel signal to a digital channel signal. The digital channel signal is provided to a processor (1240) that samples the digital channel signal and performs calculations for determining a parameter of the object, such as the Doppler frequency range, elevation, azimuth, etc. The digital channel signals from each of the analog-to-digital converters can be combined prior to being provided to the processor (1240).

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of detecting an object, comprising:
generating an electrical signal at a photodetector in response to a reflected light beam received at the photodetector, the reflected light beam being a reflection of a chirp signal from the object, wherein a bandwidth of the electrical signal is the same as a bandwidth of the chirp signal;
partitioning the electrical signal into a plurality of channels sequentially by frequency;
providing the plurality of channels to a first comb filter and a second comb filter, wherein the first comb filter includes a first plurality of outlets spaced by frequency and the second comb filter includes a second plurality of outlets spaced by frequency, wherein the frequencies of the first plurality of outlets and the frequencies of the second plurality of outlets are interleaved and span the bandwidth of the electrical signal, with a first channel directed to a first outlet of the first comb filter and a second channel directed to a first outlet of the second comb filter and then returning to the first comb filter to repeat the sequential frequency partitioning of the electrical signal;
converting, within a selected channel from an analog at one of the first comb filter and the second comb filter, the electrical signal to a digital signal, at an analog-to-digital converter associated with the selected channel; and
determining, at a processor, a parameter of the object from the digital signal in the selected channel.

2. The method of claim 1, wherein each channel of the plurality of channels has a channel bandwidth, wherein the channel bandwidths, in combination, span the bandwidth of the electrical signal.

3. The method of claim 1, wherein at least one of the at least two comb filters includes a plurality of outputs, each output associated with a respective channel, further comprising coupling an output from the selected channel to an analog-to-digital converter associated with the selected channel and providing the electrical signal within the selected channel to its associated analog-to-digital converter via the output.

4. The method of claim 3, further comprising generating a digital channel signal at each analog-to-digital converter, combining the digital channel signals, and determining the parameter of the object from the combined digital channel signals.

5. The method of claim 1, wherein the analog-to-digital converter associated with the selected channel is configured to operate over the bandwidth of the selected channel.

6. A Lidar system, comprising:
a photodetector configured to generate an electrical signal in response to a reflected light beam received at the photodetector, the reflected light beam being a reflection of a chirp signal from an object, a bandwidth of the electrical signal being the same as a bandwidth of the chirp signal;
a spectrum analyzer including:
a power divider configured to partition the electrical signal by frequency into a plurality of channels;
a first comb filter and a second comb filter, wherein the first comb filter includes a first plurality of outlets spaced by frequency and the second comb filter includes a second plurality of outlets spaced by frequency, wherein the frequencies of the first plurality of outlets and the frequencies of the second plurality of outlets are interleaved and span the bandwidth of the electrical signal, wherein the power divider partitions the channels sequentially by frequency with a first channel directed to a first outlet of the first comb filter, a second channel directed to a first outlet of the second comb filter and returning to the first comb filter to repeat the frequency partitioning of the electrical signal;
an analog-to-digital converter associated with a selected channel one of the first comb filter and the second comb filter configured to convert the electrical signal within the selected channel from an analog signal to a digital signal;
a comb filter for configured to provide output from the selected channel of the power divider to the analog-to-digital converter; and
a processor configured to determine a parameter of the object from the digital signal in the selected channel.

7. The Lidar system of claim 6, wherein each channel of the plurality of channels has a channel bandwidth and the channel bandwidths, in combination, span a bandwidth of the electrical signal.

8. The Lidar system of claim 6, wherein at least one of the at least two comb filters includes a plurality of outputs, each output associated with a respective channel and coupled to an associated analog-to-digital converter, the output configured to provide the electrical signal within the selected channel to its associated analog-to-digital converter.

9. The Lidar system of claim 8, wherein the plurality of analog-to-digital converters generate a plurality of digital signals and the processor is further configured to combine the plurality of digital signals and determine the parameter of the object from the combined plurality of digital signals.

10. The Lidar system of claim 6, wherein the analog-to-digital converter associated with the selected channel is configured to operate over the bandwidth of the selected channel.

11. A Lidar system, comprising:
a photonic chip configured to generate a chirp signal and receive a reflected light beam that is a reflection of the chirp signal from an object, the chirp signal having an associated bandwidth;
a photodetector of the photonic chip configured to generate an electrical signal in response to receiving the reflected light beam, a bandwidth of the electrical signal being the same as the bandwidth of the chirp signal;
a spectrum analyzer including:
a power divider configured to partition the electrical signal by frequency into a plurality of channels;
a first comb filter and a second comb filter, wherein the first comb filter includes a first plurality of outlets spaced by frequency and the second comb filter includes a second plurality of outlets spaced by frequency, wherein the frequencies of the first plurality of outlets and the frequencies of the second plurality of outlets are interleaved and span the bandwidth of the electrical signal, wherein the power divider partitions the channels sequentially by frequency with a first channel directed to a first outlet of the first comb filter, a second channel directed to a first outlet of the second comb filter and returning to the first comb filter to repeat the frequency partitioning the electrical signal;

an analog-to-digital converter configured associated with a selected channel one of the first comb filter and the second comb filter to convert the electrical signal within the selected channel from an analog signal to a digital signal;

a comb filter configured to provide the output from the selected channel of the power divider to the analog-to-digital converter; and a processor configured to determine a parameter of the object from the digital signal in the selected channel.

12. The Lidar system of claim 11, wherein each channel of the plurality of channels has a channel bandwidth and the channel bandwidths, in combination, span a bandwidth of the electrical signal.

13. The Lidar system of claim 11, wherein at least one of the at least two comb filters includes a plurality of outputs, each output associated with a respective channel and coupled to an associated analog-to-digital converter, the output configured to provide the electrical signal within the selected channel to its associated analog-to-digital converter.

14. The Lidar system of claim 13, wherein the plurality of analog-to-digital converts generate a plurality of digital signals and the processor is further configured to combine the plurality of digital signals and determine the parameter of the object from the combined plurality of digital signals.

15. The Lidar system of claim 11, wherein the analog-to-digital converter associated with the selected channel is configured to operate over the bandwidth of the selected channel.

* * * * *